United States Patent
Lin et al.

(10) Patent No.: US 6,903,381 B2
(45) Date of Patent: Jun. 7, 2005

(54) LIGHT-EMITTING DIODE WITH CAVITY CONTAINING A FILLER

(75) Inventors: Ming-Der Lin, Hsinchu (TW); Chang-Da Tsai, Taoyuan (TW)

(73) Assignee: Opto Tech Corporation, Hsinchu (TW)

( * ) Notice: Subject to any disclaimer, the term of this patent is extended or adjusted under 35 U.S.C. 154(b) by 57 days.

(21) Appl. No.: 10/421,742

(22) Filed: Apr. 24, 2003

(65) Prior Publication Data

US 2004/0211968 A1 Oct. 28, 2004

(51) Int. Cl.$^7$ ............................................. H01L 33/00
(52) U.S. Cl. ......................... 257/99; 257/81; 257/91; 257/98
(58) Field of Search .......................... 257/79, 81, 91, 257/98, 99

(56) References Cited

U.S. PATENT DOCUMENTS

| | | | | |
|---|---|---|---|---|
| 4,864,369 A | * | 9/1989 | Snyder et al. | 257/97 |
| 5,502,316 A | * | 3/1996 | Kish et al. | 257/94 |
| 6,221,683 B1 | * | 4/2001 | Nirschl et al. | 438/47 |
| 6,245,588 B1 | * | 6/2001 | Abe | 438/22 |
| 6,492,661 B1 | * | 12/2002 | Chien et al. | 257/98 |
| 6,512,248 B1 | * | 1/2003 | Takeuchi et al. | 257/81 |
| 6,844,571 B2 | * | 1/2005 | Krames et al. | 257/81 |
| 2003/0085851 A1 | * | 5/2003 | Horng et al. | 345/46 |

* cited by examiner

Primary Examiner—George Eckert
(74) Attorney, Agent, or Firm—Rosenberg, Klein & Lee

(57) ABSTRACT

The present invention discloses a light-emitting diode and a method for manufacturing such a light-emitting diode with a direct band-gap III-V compound semiconductor material on a GaAs substrate. It is implemented by forming a first conductive electrode on the top edge of the epitaxial LED layer and a second conductive electrode opposite the first conductive electrode on the edge of a transparent substrate. Further, after the first conductive electrode and second conductive electrode are connected by chip bonding skill, it is selectively to remove the GaAs substrate and plate a transparent electrode on the top portion of the epitaxial LED layer. Therefore, when casting from P-N junction of the light-emitting diode, the light will go through with directions of the top portion of epitaxial layer and transparent substrate.

14 Claims, 6 Drawing Sheets

LIGHT-EMITTING DIODE WITH CAVITY CONTAINING A FILLER

BACKGROUND OF THE INVENTION

1. Field of the Invention

The present invention generally relates to a light-emitting diode and a method for manufacturing the same and, more particularly, to a light-emitting diode with enhanced brightness and a method for manufacturing such a light-emitting diode with a direct band-gap III-V compound semiconductor material on a GaAs substrate. The present invention relates to an improvement to Taiwan Patent Publication No. 41516 "Light-emitting diode with enhanced brightness and method for fabricating the same" filed by the inventors of present invention.

2. Description of the Prior Art

The light-emitting diode (to be abbreviated as LED hereinafter) has received considerable attention for its advantages such as long lifetime, small size, low heat generation, low power consumption, high response speed, monochromic lighting ability, etc. and has been widely used in applications such as computer peripherals, clock displays, display panels, and many other 3C (computer, communication and consumer) products since the 1960s. Particularly, the development in high brightness LEDs has successfully facilitated the LED applications to extend from indoors to outdoors.

The LED, especially in the range of visible wavelength, has an epitaxial structure of different band-gap types and light-emitting wavelengths according to substrate materials. When a direct band-gap III-V compound semiconductor material such as GaAs is used as a substrate of an LED, the GaAs substrate absorbs a considerable amount of incident light and adversely affects the brightness of the LED. On the other hand, when an indirect band-gap III-V compound semiconductor material such as GaP is used as a substrate of an LED, the LED exhibits enhanced brightness because the GaP substrate is translucent and thus the amount of incident light absorbed by the GaP substrate is comparatively reduced. However, using such an indirect band-gap material complicates the manufacturing process because it suffers from poor light-emitting efficiency and needs to be doped with some impurities to improve the efficiency through lattice vibration or dispersion centers. As a result, the manufacturing cost is increased when the indirect band-gap material is used for the LED.

Accordingly, the inventors of the present invention disclosed a substrate for LED's employing a direct band-gap epitaxial material. The substrate reflects the light emitted from the LED instead of absorbing it such that the light-emitting efficiency is increased, as discussed in Taiwan Patent Publication No. 41516 "Light-emitting diode with enhanced brightness and method for fabricating the same."

The above prior art is described as shown in FIG. 1, which comprises: an epitaxial LED layer 34 including a P-N junction; a bonded reflection layer 40 under the epitaxial LED layer 34; and a conductive substrate 42 under the bonded reflection layer 40. The light emitted from the P-N junction (as indicated by the dashed line with an arrow $a_4$) is reflected by the bonded reflection layer 40 and travels through the LED layer 34. A back electrode 46 is formed at a bottom surface of the conductive substrate 42. A GaAs substrate 32 and a front electrode 48 are formed in sequence on the epitaxial LED layer 34. The GaAs substrate 32 and a front electrode 48 are designed smaller than the epitaxial LED layer 34 in size such that the amount of the front light ($L_4$) emitting out of the LED can be increased. To simplify the manufacturing process, it is possible that the front electrode 48 and the epitaxial LED layer 34 are designed to have the same area in size such that only the reflected light $a_4$ and most of the lateral light $r_4$ contribute to the emitted light. Under such a configuration, if part of the light emitted from the P-N junction of the epitaxial LED layer 34 travels towards the bonded reflection layer 40 (as indicated by the dashed line with an arrow $a_4$), the light will be reflected by the bonded reflection layer 40 and travel through the LED layer 34, enhancing the LED brightness.

Even though, in the prior art filed by the present inventors, LED's with enhanced brightness can be achieved, there still exist some problems left unsolved as follow:

1. Even though the conductive substrate 42 plays the role that replaces GaAs, the opaque bonded reflection layer 40 limits the LED brightness because part of the reflected light may be absorbed inside the LED.
2. The electric current tends to flow through the shortest and the most conductive path; therefore, most of the light is generated at the center of the P-N junction such that the optical path for the light source is increased and the LED brightness is adversely affected. Moreover, the P-N junction of the LED is not uniformly used.
3. The conductive substrate limits the chosen materials, which may be unfavorable for cost down.

Therefore, there is need in providing a light-emitting diode and a method for manufacturing such a light-emitting diode so as to improve the light intensity and reduce the manufacturing cost.

SUMMARY OF THE INVENTION

Accordingly, it is the primary object of the present invention to provide a light-emitting diode and a method for manufacturing such a light-emitting diode, so as to improve the light intensity and reduce the manufacturing cost.

It is another object of the present invention to provide a light-emitting diode and a method for manufacturing such a light-emitting diode, in which an opposed electrode surrounding the bottom edge of the epitaxial LED layer is used to conduct the electric current towards the entire epitaxial LED layer such that the P-N junction is uniformly employed as a light source and the optical path for the light source is shortened, enhancing the LED brightness.

It is still another object of the present invention to provide a light-emitting diode and a method for manufacturing such a light-emitting diode, in which a transparent material is used as the substrate such that the light emitted from the P-N junction travels through the substrate, increasing the flexibility of the chosen materials and thus reducing the cost.

In order to achieve the foregoing objects, the present invention provides a light-emitting diode, comprising: an epitaxial LED layer having a P-N junction; a first conductive electrode formed on the top edge of the epitaxial LED layer; a transparent substrate; a second conductive electrode formed on the top edge of the transparent substrate, wherein the second conductive electrode is connected to the first conductive electrode formed on the top edge of the epitaxial LED layer such that the first conductive electrode and the second conductive electrode functions as an opposed electrode and supports the epitaxial LED layer; and a front electrode formed on a top surface of the epitaxial LED layer, thereby forming an electric current path between the front electrode and the opposed electrode.

The present invention further provides a method for manufacturing a light-emitting diode, comprising steps of:

forming an epitaxial LED structure having a P-N junction on a GaAs substrate; forming a first conductive electrode on the top edge of the epitaxial LED layer; forming a second conductive electrode on the top edge of a transparent substrate; forming an opposed electrode by combining the first conductive electrode and the second conductive electrode; selectively removing most of the GaAs substrate; and forming a front electrode on the remaining portion of the GaAs substrate.

Other and further features, advantages and benefits of the invention will become apparent in the following description taken in conjunction with the following drawings. It is to be understood that the foregoing general description and following detailed description are exemplary and explanatory but are not to be restrictive of the invention. The accompanying drawings are incorporated in and constitute a part of this application and, together with the description, serve to explain the principles of the invention in general terms. Like numerals refer to like parts throughout the disclosure.

BRIEF DESCRIPTION OF THE DRAWINGS

The objects, spirits and advantages of the preferred embodiments of the present invention will be readily understood by the accompanying drawings and detailed descriptions, wherein.

DETAILED DESCRIPTION OF THE INVENTION

The present invention providing a light-emitting diode with enhanced brightness and a method for manufacturing the same can be exemplified by the preferred embodiments as described hereinafter.

To start with, please refer to FIG. 2A to FIG. 2F, which are cross-sectional views showing the manufacturing process for an LED in accordance with one embodiment of the present invention. The LED with a direct band-gap III-V compound semiconductor material such as AlGaInAsP is formed on a GaAs substrate. Therefore, the method according to the present invention includes the following steps.

Figure 1:
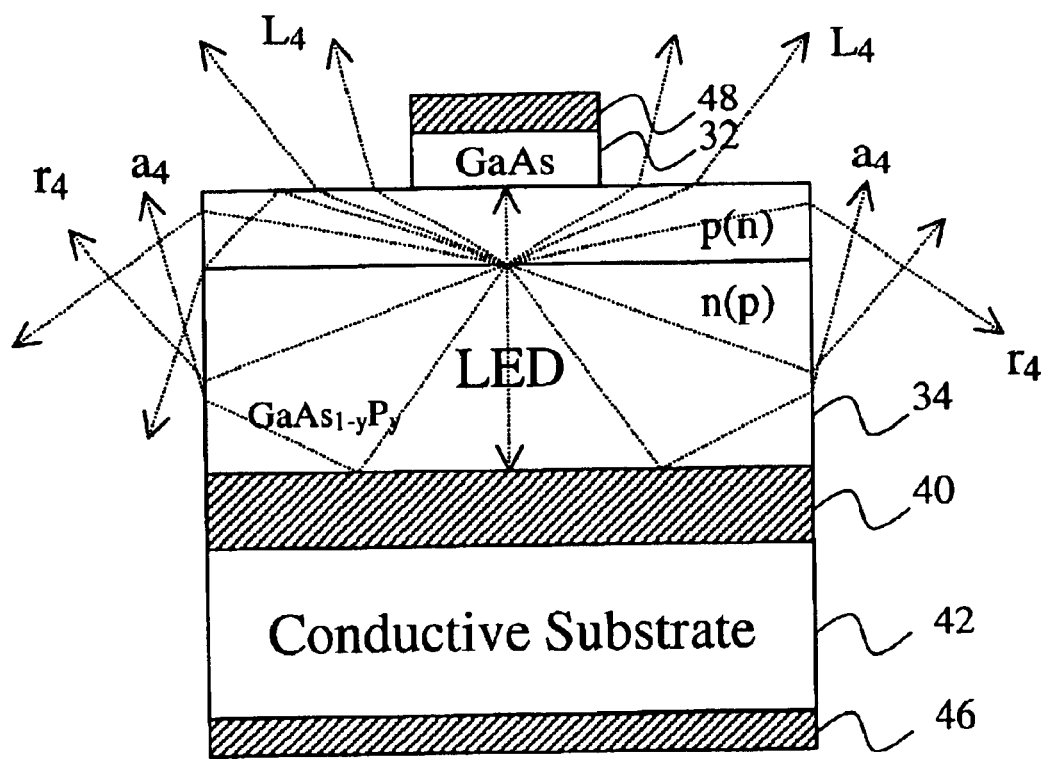
FIG. 1 is a cross-sectional view showing a light-emitting diode in accordance with the prior art.
Figure 2A:
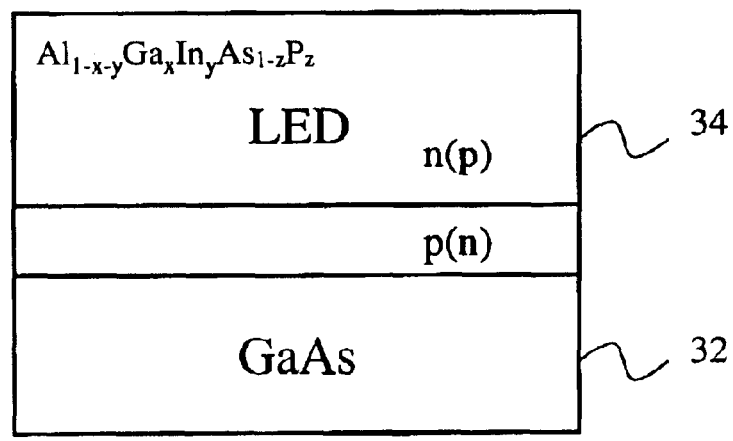
FIG. 2A to FIG. 2F are cross-sectional views showing the manufacturing process for an LED in accordance with one embodiment of the present invention.

Step 1: An epitaxial LED layer 34 having a P-N junction (or n-p junction as shown in the brackets in FIG. 2A) is formed on a GaAs substrate 32, as shown in FIG. 2A.

Figure 2B:
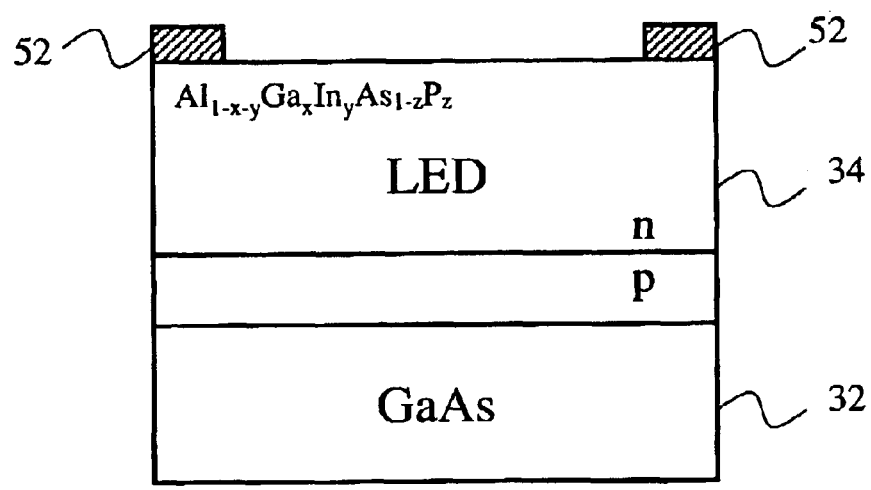

Step 2: A first conductive electrode 52 is formed by depositing technology on the epitaxial LED layer 34 where the epitaxial LED layer 34 is not connected to the GaAs substrate 32, as shown in FIG. 2B.

Figure 2C:
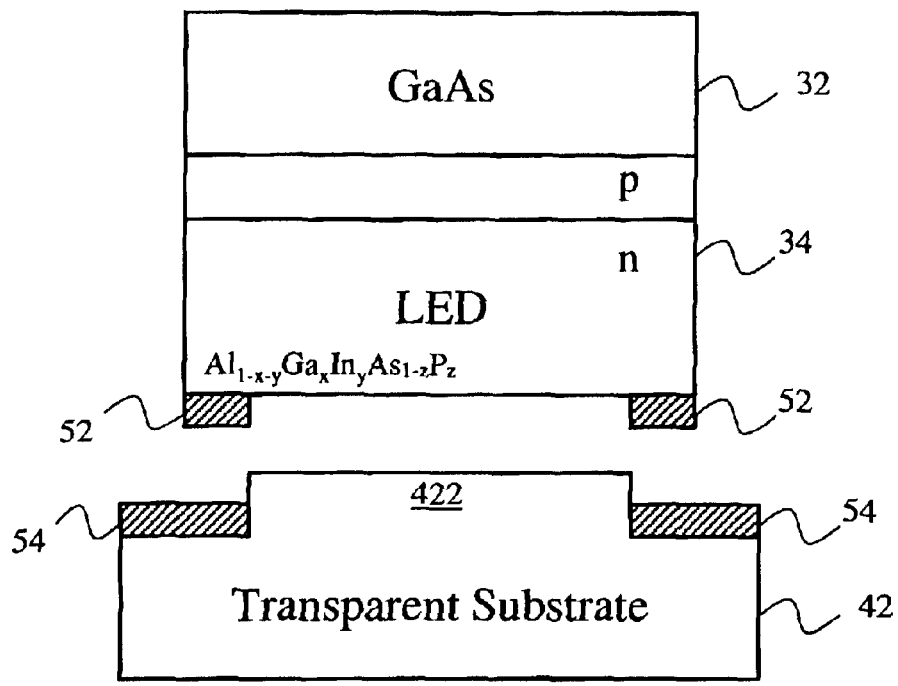

Step 3: A second conductive electrode 54 is formed on a top edge of a transparent substrate 42 formed of a material selected from a group consisting of glass, quartz, GaP, epoxy resin and their combination. A protuberance 422 with a height larger than the second conductive electrode 54 is formed on a top portion of the transparent substrate 42 uncovered by the second conductive electrode 54. The epitaxial LED layer 34 formed in Step 2 is turned upside down such that the second conductive electrode 54 formed on the transparent substrate 42 faces the first conductive electrode 52 formed on the epitaxial LED layer 34, as shown in FIG. 2C.

Figure 2D:
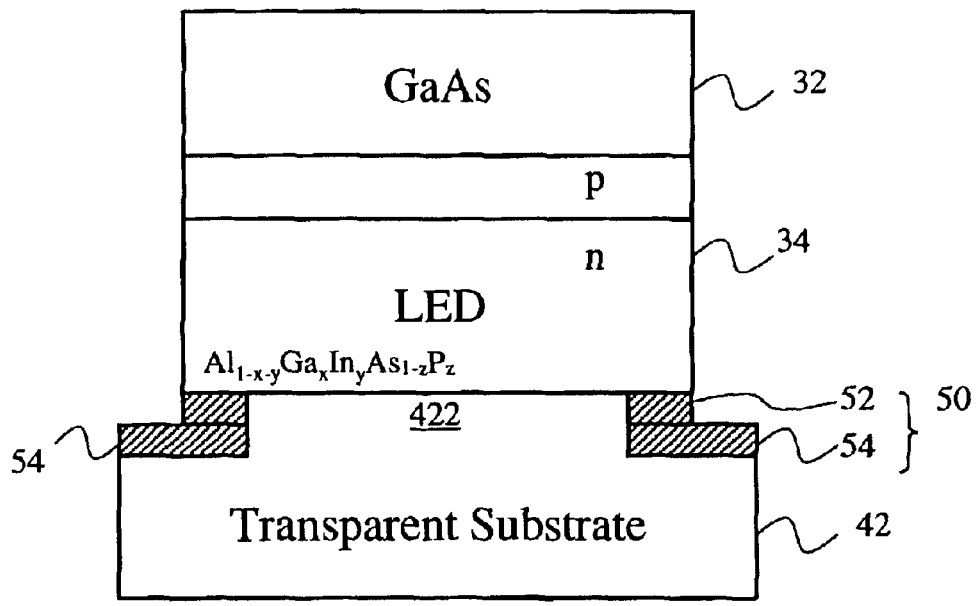

Step 4: The first conductive electrode 52 formed on the epitaxial LED layer 34 and the second conductive electrode 54 formed on the transparent substrate 42 are bonded by wafer bonding technology, thereby forming an opposed electrode 50 as an electrode for the LED. The protuberance 422 of the transparent substrate 42 contacts the bottom edge of the epitaxial LED layer 34 so as to support the epitaxial LED layer 34, as shown in FIG. 2D.

Figure 2E:
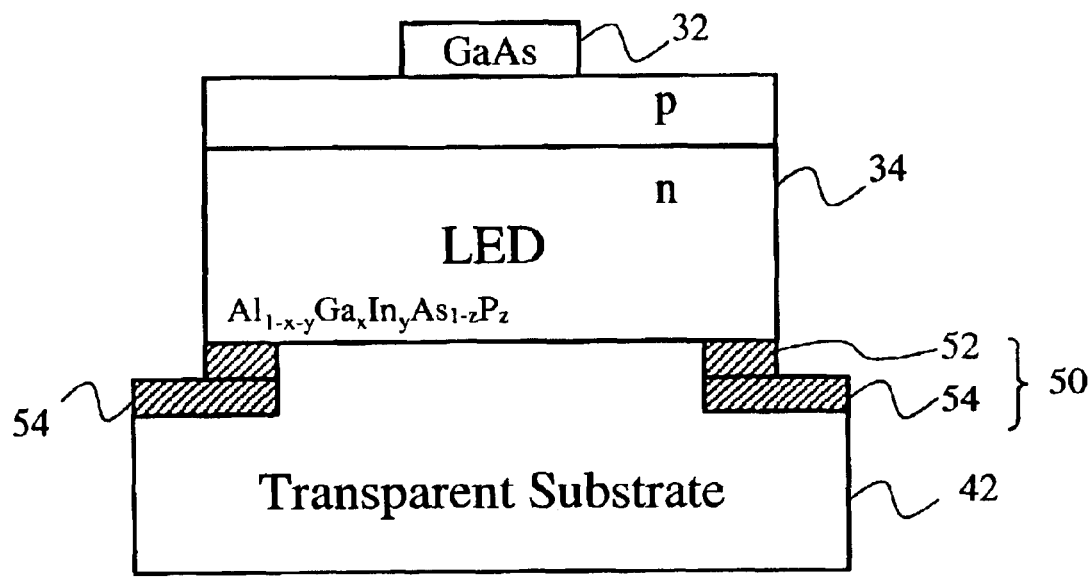

Step 5: Most of the GaAs substrate 32 is selectively removed by chemical etching or mechanical polishing, such that the remaining portion of the GaAs substrate 32 functions as an ohmic contact for a front electrode. The remaining portion of the GaAs substrate 32 has the same size as the area where the front electrode is to be formed, as shown in FIG. 2E.

Figure 2F:
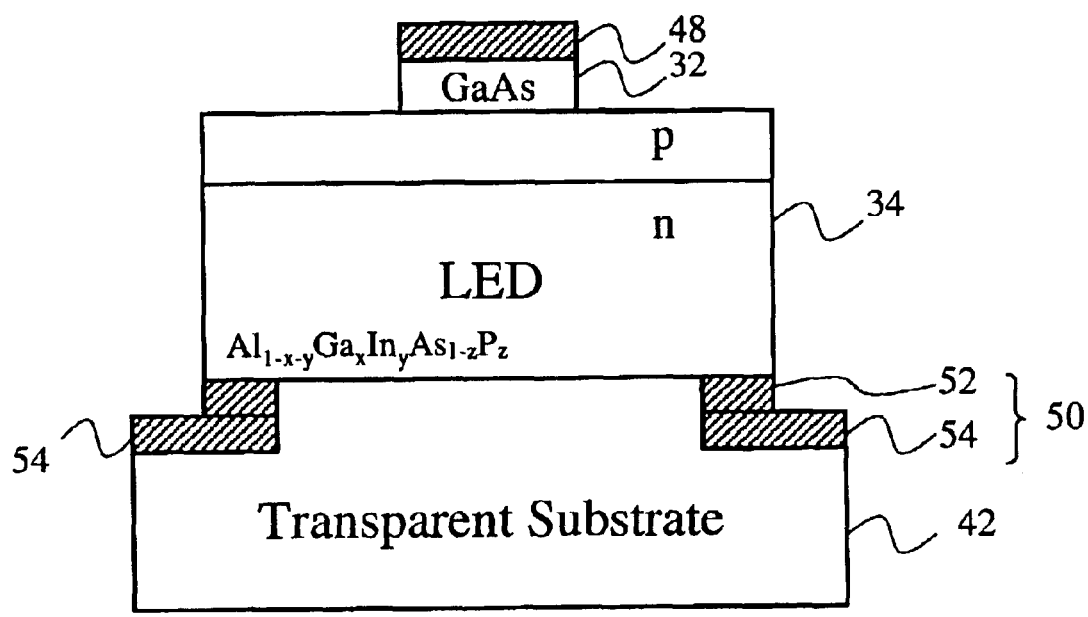

Step 6: The front electrode 48 is formed by sputtering or evaporation on the remaining portion of the GaAs substrate 32. The light is emitted from the P-N junction towards the front surface of the epitaxial LED layer 34 and the transparent substrate 42 when the electric current flows through the P-N junction in the epitaxial LED layer 34, as shown in FIG. 2F.

Since the GaAs substrate 32 is opaque, the front electrode 48 can also be formed of an opaque material. In other words, the opaque front electrode 48 has no effect on the light intensity from the LED.

Figure 3:
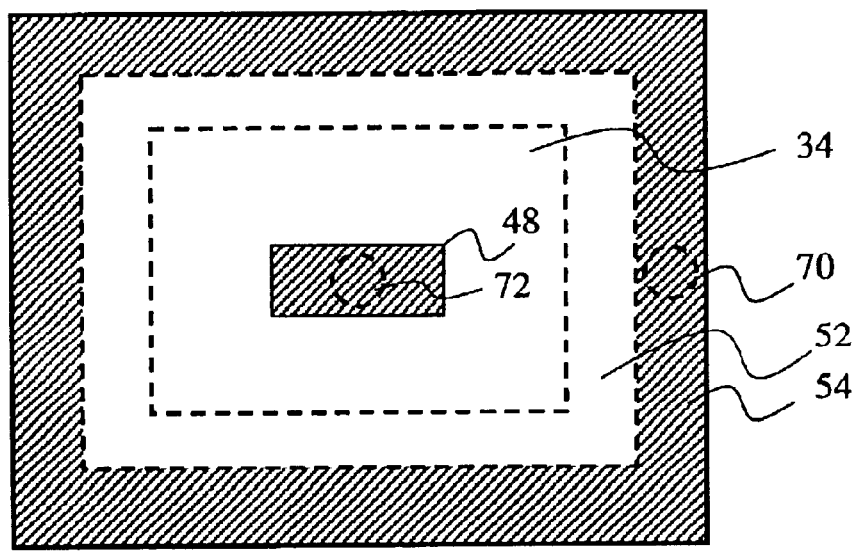
FIG. 3 is a top view showing the LED in accordance with one embodiment of the present invention.

Moreover, during the operation of the LED, the electric current uniformly flows from the front electrode 48 towards the opposed electrode 50 on the bottom portion of the epitaxial LED layer 34, such that the area of the P-N junction that functions as the light source is larger and the optical path is uniform and shortened, which enhances the LED brightness and uniformity. Please also refer to FIG. 3, which is a top view showing the LED in FIG. 2F. Since the area of the second conductive electrode 54 on the transparent substrate 42 is larger than the first conductive electrode 52 on the epitaxial LED layer 34 and the second conductive electrode 54 surrounds the first conductive electrode 52, during pad bonding, the pad bonding area 72 for the front electrode 48 is determined on the surface of the front electrode 48 (as shown by the dotted circle), while the pad bonding area 70 for the opposed electrode 50 is determined on the surface of the second conductive electrode 54. That simplifies the manufacturing process.

In the afore-mentioned embodiment, the area of the second conductive electrode 54 is designed to be larger than that of the first conductive electrode 52, thereby simplifying the pad bonding process. Without a doubt, the present invention is applicable to the surface mounted device (SMD). In other words, there variations of the areas of the first conductive electrode 52 and the second conductive electrode 54 and the pad bonding portion can be determined either on the first conductive electrode 52 or on the second conductive electrode 54.

Figure 4:
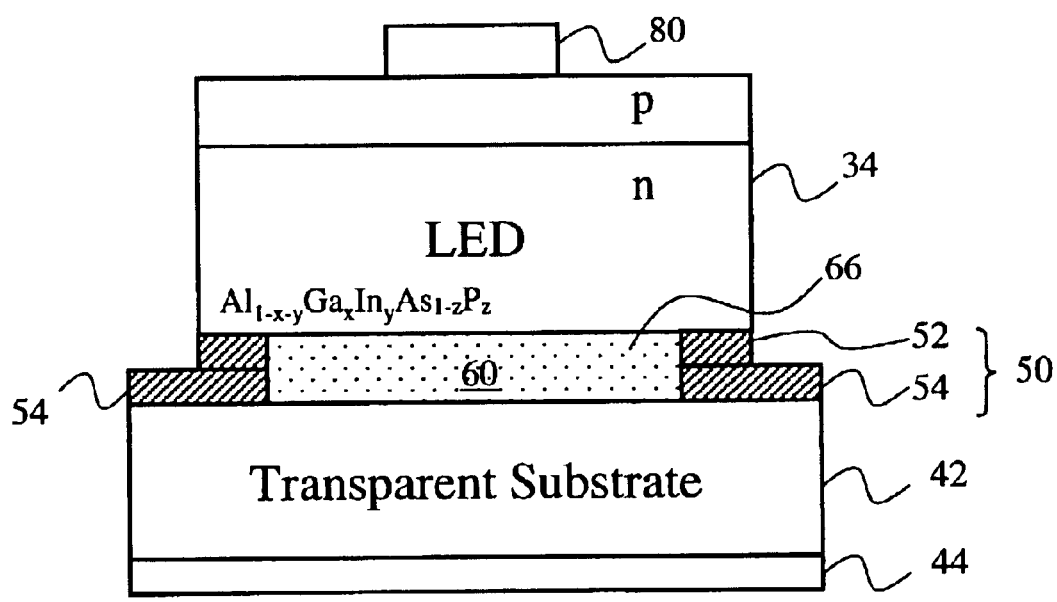
FIG. 4 is a cross-sectional view showing a light-emitting diode in accordance with another embodiment of the present invention.

Moreover, please refer to FIG. 4, which is a cross-sectional view showing a light-emitting diode in accordance with another embodiment of the present invention. As shown in the figure, in the present embodiment, the transparent substrate 42 does not have a protuberance and the second conductive electrode 54 is formed on the transparent substrate 42. As a result, as the second conductive electrode 54 formed on the transparent substrate 42 contacts the first conductive electrode 52 formed on the epitaxial LED layer 34, a cavity 60 is formed between the epitaxial LED layer 34 (uncovered by the opposed electrode 50) and the top portion of the transparent substrate 42. In order to strengthen the cavity 60 for supporting the epitaxial LED layer 34 and allow more possible variations, a variable color-casting material or a fluorescent powder 66 as a filler is filled into the cavity 60. Furthermore, in order to reduce the reflection loss of the incident light due to interface variation, the filler 66 can be implemented by using an anti-reflection film so as to enhance the transmission coefficient and thus the transmitted light intensity.

Moreover, a reflection film 44 is formed on the bottom portion of the transparent substrate 42 or the top portion of the epitaxial LED layer 34 so as to enhance the intensity of light emitted from the LED.

In addition, in order to reduce the negative effect resulting from the GaAs substrate 32 on the top portion of the epitaxial LED layer 34, chemical etching or mechanical polishing can be used to remove the entire the GaAs substrate 32, followed by sputtering or evaporating on the epitaxial LED layer 34 a transparent electrode 80 formed of a material selected from a group consisting of ZnO, InO, SnO and ITO.

Figure 5A:
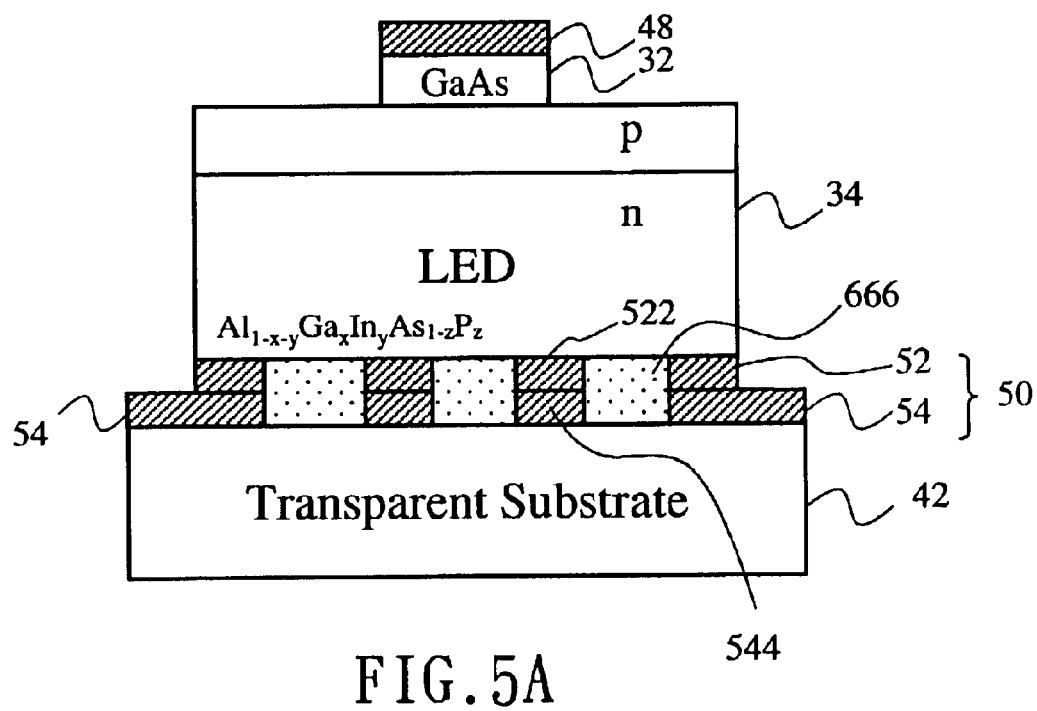
FIG. 5A is a cross-sectional view showing a light-emitting diode in accordance with still another embodiment of the present invention.
Figure 5B:
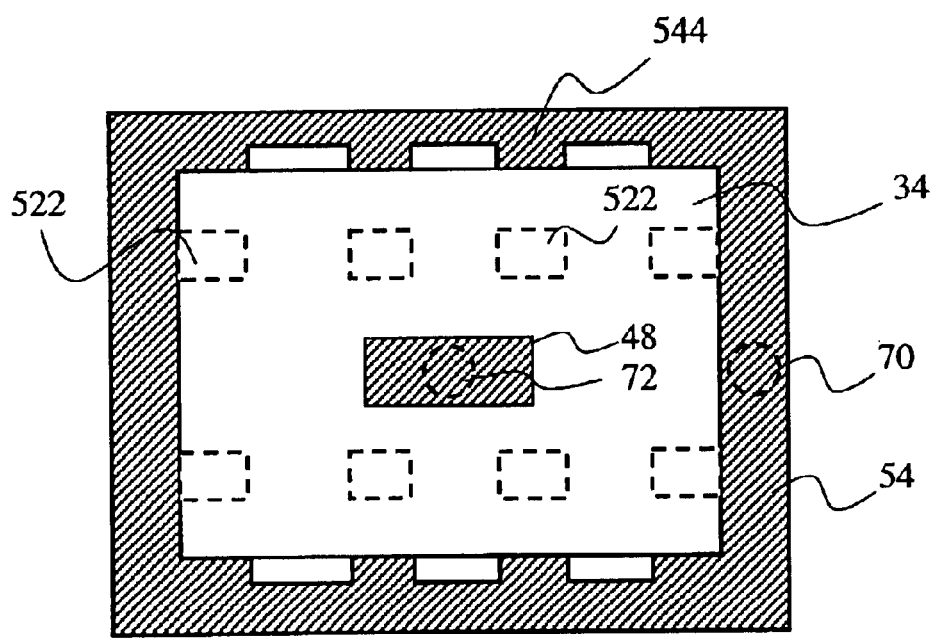
FIG. 5B is a top view showing the light-emitting diode in FIG. 5A.

At last, please refer to FIG. 5A and FIG. 5B, which represent a cross-sectional view and a top view, respectively, showing a light-emitting diode in accordance with still another embodiment of the present invention. As shown in the figures, in order to allow the electric current to flow more uniformly through the P-N junction in the epitaxial LED layer 34, at least a fourth conductive electrode 544 is formed across the bottom portion of the epitaxial LED layer 34 in addition to the second conductive electrode 54 on the transparent substrate 42. Moreover, at least a third conductive electrode 522 (as indicated by the dotted square) is formed corresponding to the fourth conductive electrode 544 in addition to the first conductive electrode 52 on the epitaxial LED layer 34. Therefore, as the third conductive electrode 522 contacts the fourth conductive electrode 544, the intensity of light emitted from the LED is enhanced because the electric current distributes more uniformly.

According to the above discussion, it is apparent that the present invention discloses a light-emitting diode with enhanced brightness and a method for manufacturing such a light-emitting diode with a direct band-gap III-V compound semiconductor material on a GaAs substrate. The present invention relates to an improvement to Taiwan Patent Publication No. 41516 "Light-emitting diode with enhanced brightness and method for fabricating the same" filed by the inventors of present invention. Therefore, the present invention has been examined to be novel, unobvious and useful.

Although this invention has been disclosed and illustrated with reference to particular embodiments, the principles involved are susceptible for use in numerous other embodiments that will be apparent to persons skilled in the art. This invention is, therefore, to be limited only as indicated by the scope of the appended claims.

What is claimed is:

1. A light-emitting diode, comprising:
   an epitaxial LED layer having a P-N junction;
   a first conductive electrode formed on an edge of said epitaxial LED layer;
   a transparent substrate;
   a second conductive electrode formed on an edge of said transparent substrate, wherein said second conductive electrode is connected to said first conductive electrode formed on the edge of said epitaxial LED layer such that said first conductive electrode and said second conductive electrode form an opposed electrode for supporting said epitaxial LED layer, a cavity being formed between said transparent substrate and said epitaxial LED layer and supported by said opposed electrode, said cavity containing a filler formed by a variable color-casting material; and
   a front electrode formed on a top surface of said epitaxial LED layer, thereby forming a current path between said front electrode and said opposed electrode.

2. The light-emitting diode as recited in claim 1, wherein said transparent substrate has a protuberance with a height larger than said second conducive electrode such that said protuberance is placed in said cavity and contacts a bottom portion of said epitaxial LED layer.

3. The light-emitting diode as recited in claim 1, wherein said transparent substrate further includes at least a fourth conductive electrode formed thereon, said fourth conductive electrode being overlaid and connected to a third conductive electrode formed on a bottom portion of said epitaxial LED layer.

4. The light-emitting diode as recited in claim 1, wherein said transparent substrate is formed of a material selected from a group consisting of glass, quartz, GaP, epoxy resin and their combination.

5. The light-emitting diode as recited in claim 1, wherein said epitaxial LED layer is formed of a direct band-gap III-V compound semiconductor material.

6. The light-emitting diode as recited in claim 1, wherein said front electrode is a transparent electrode formed of a transparent material.

7. The light-emitting diode as recited in claim 6, wherein said transparent electrode is formed of a material selected from a group consisting of ZnO, InO, SnO and ITO.

8. The light-emitting diode as recited in claim 1, further comprising a GaAs substrate formed between said epitaxial LED layer and said front electrode.

9. The light-emitting diode as recited in claim 8, wherein the superficial measurement of said GaAs substrate and said front electrode are smaller than epitaxial LED layer in size.

10. The light-emitting diode as recited in claim 1, further comprising a reflection film formed on a bottom portion of said transparent substrate.

11. A light-emitting diode, comprising:
    an epitaxial LED layer having a P-N junction;
    a first conductive electrode formed on an edge of said epitaxial LED layer;
    a transparent substrate; a second conductive electrode formed on an edge of said transparent substrate, wherein said second conductive electrode is connected to said first conductive electrode formed on the edge of said epitaxial LED layer such that said first conductive electrode and said second conductive electrode form an opposed electrode for supporting said epitaxial LED layer, a cavity being formed between said transparent substrate and said epitaxial LED layer and supported by said opposed electrode, said cavity containing a filler formed by a fluorescent powder; and
    a front electrode formed on a top surface of said epitaxial LED layer, thereby forming a current path between said front electrode and said opposed electrode.

12. The light-emitting diode as recited in claim 11, wherein said transparent substrate has a protuberance with a height larger than said second conductive electrode such that said protuberance is placed in said cavity and contacts a bottom portion of said epitaxial LED layer.

13. A light-emitting diode, comprising:

an epitaxial LED layer having a P-N junction;

a first conductive electrode formed on an edge of said epitaxial LED layer;

a transparent substrate; a second conductive electrode formed on an edge of said transparent substrate, wherein said second conductive electrode is connected to said first conductive electrode formed on the edge of said epitaxial LED layer such that said first conductive electrode and said second conductive electrode form an opposed electrode for supporting said epitaxial LED layer, a cavity being formed between said transparent substrate and said epitaxial LED layer and supported by said opposed electrode, said cavity containing a filler formed by an anti-reflection film; and a front electrode formed on a top surface of said epitaxial LED layer, thereby forming a current path between said front electrode and said opposed electrode.

14. The light-emitting diode as recited in claim 13, wherein said transparent substrate has a protuberance with a height larger than said second conductive electrode such that said protuberance is placed in said cavity and contacts a bottom portion of said epitaxial LED layer.

* * * * *